US012159963B2

(12) United States Patent
Yoon et al.

(10) Patent No.: US 12,159,963 B2
(45) Date of Patent: Dec. 3, 2024

(54) DISPLAY APPARATUS INCLUDING A LOW BRIGHTNESS AREA

(71) Applicant: SAMSUNG ELECTRONICS CO., LTD., Suwon-si (KR)

(72) Inventors: Junghoon Yoon, Suwon-si (KR); Wonyong Lee, Suwon-si (KR); Hochul Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 553 days.

(21) Appl. No.: 17/431,866

(22) PCT Filed: May 21, 2021

(86) PCT No.: PCT/KR2021/006351
§ 371 (c)(1),
(2) Date: Aug. 18, 2021

(87) PCT Pub. No.: WO2022/050530
PCT Pub. Date: Mar. 10, 2022

(65) Prior Publication Data
US 2023/0144026 A1    May 11, 2023

(30) Foreign Application Priority Data

Sep. 2, 2020    (KR) .................. 10-2020-0111769

(51) Int. Cl.
*H01L 33/58*    (2010.01)
*H01L 23/00*    (2006.01)
*H01L 25/075*    (2006.01)

(52) U.S. Cl.
CPC ............. *H01L 33/58* (2013.01); *H01L 24/29* (2013.01); *H01L 25/0753* (2013.01);
(Continued)

(58) Field of Classification Search
CPC ...... H01L 33/58; H01L 24/29; H01L 25/0753; H01L 24/32; H01L 2224/29021;
(Continued)

(56) References Cited

U.S. PATENT DOCUMENTS 7,710,023 B2    5/2010    Hong et al.
8,922,463 B2    12/2014    Noh et al.
(Continued)

FOREIGN PATENT DOCUMENTS

JP    7-5824 A    1/1995
JP    2002-374004 A    12/2002
(Continued)

OTHER PUBLICATIONS

Communication dated Sep. 13, 2023 issued by the European Patent Office in European Application No. 21864496.1.
(Continued)

*Primary Examiner* — Sahlu Okebato
(74) *Attorney, Agent, or Firm* — Sughrue Mion, PLLC

(57) ABSTRACT

A display apparatus includes: a substrate; and a plurality of light emitting diode (LED) elements disposed on the substrate in a matrix form, wherein the plurality of LED elements includes: a first LED element including a first light emitting layer, a second LED element including a second light emitting layer, and a third LED element including a third light emitting layer, wherein the first LED element, the second LED element, and the third LED element are disposed in a column direction of the plurality of LED elements, and constitute one pixel together, and wherein the first light emitting layer, the second light emitting layer, and the third light emitting layer respectively comprises a first weak light-emitting area, a second weak light-emitting area, and a third weak light-emitting area that are aligned in a line in the column direction.

17 Claims, 12 Drawing Sheets

(52) U.S. Cl.
CPC .... *H01L 24/32* (2013.01); *H01L 2224/29021* (2013.01); *H01L 2224/32225* (2013.01); *H01L 2924/12041* (2013.01)

(58) Field of Classification Search
CPC . H01L 2224/32225; H01L 2924/12041; H01L 33/20; H01L 33/382; H01L 33/54; H01L 25/167; H01L 33/62; H01L 23/29; H01L 23/528; H01L 33/24; G09G 3/2088; G09G 2300/026; G09G 2300/0804; G09G 2320/0233; G09G 2320/028; G09G 3/32
See application file for complete search history.

(56) References Cited

U.S. PATENT DOCUMENTS

| | | | |
|---|---|---|---|
| 9,029,895 | B2 | 5/2015 | Lee et al. |
| 9,240,533 | B2 | 1/2016 | Lee et al. |
| 11,521,955 | B2 | 12/2022 | Kim et al. |
| 2005/0093016 | A1 | 5/2005 | Yamamoto et al. |
| 2006/0267490 | A1 | 11/2006 | Hong et al. |
| 2009/0261360 | A1* | 10/2009 | Yasukawa .............. H10K 50/18 257/89 |
| 2011/0222375 | A1* | 9/2011 | Tsubata ................ G04G 21/02 368/11 |
| 2011/0260954 | A1 | 10/2011 | Noh et al. |
| 2014/0084317 | A1 | 3/2014 | Lee et al. |
| 2015/0214448 | A1 | 7/2015 | Lee et al. |
| 2018/0190728 | A1* | 7/2018 | Wu ........................ H10K 50/13 |
| 2019/0108785 | A1 | 4/2019 | Green et al. |
| 2019/0131282 | A1 | 5/2019 | Liu et al. |
| 2019/0378452 | A1 | 12/2019 | Lin et al. |
| 2020/0083397 | A1* | 3/2020 | Lee ...................... H01L 27/156 |
| 2020/0203586 | A1 | 6/2020 | Kimura et al. |
| 2020/0235084 | A1 | 7/2020 | Wu et al. |
| 2020/0321322 | A1 | 10/2020 | Kim et al. |
| 2020/0379299 | A1 | 12/2020 | Hibino et al. |

FOREIGN PATENT DOCUMENTS

| | | | |
|---|---|---|---|
| JP | 3690643 | B2 | 8/2005 |
| JP | 2005-285874 | A | 10/2005 |
| JP | 2010244848 | A | 10/2010 |
| KR | 100683403 | B1 | 2/2007 |
| KR | 1020090111082 | A | 10/2009 |
| KR | 101243924 | B1 | 3/2013 |
| KR | 1020140039594 | A | 4/2014 |
| KR | 10-2015-0066507 | A | 6/2015 |
| KR | 1020190072965 | A | 6/2019 |
| KR | 102059030 | B1 | 12/2019 |
| KR | 1020200079122 | A | 7/2020 |
| WO | 2019176785 | A1 | 9/2019 |

OTHER PUBLICATIONS

International Search Report (PCT/ISA/210) dated Aug. 30, 2021 issued by the International Searching Authority in International Application No. PCT/KR2021/006351.

Written Opinion (PCT/ISA/237) dated Aug. 30, 2021 issued by the International Searching Authority in International Application No. PCT/KR2021/006351.

Communication dated Jan. 9, 2023 issued by the Korean Patent Office in Korean Application No. 10-2020-0111769.

Communication dated May 14, 2024, issued by the India Intellectual Property Office in Indian Patent Application No. 202317011418.

\* cited by examiner

| 110-1 | 110-2 | 110-3 | 110-4 |
| 110-5 | 110-6 | 110-7 | 110-8 |
| 110-9 | 110-10 | 110-11 | 110-12 |

DISPLAY APPARATUS INCLUDING A LOW BRIGHTNESS AREA

BACKGROUND

Technical Field

This disclosure relates to a display apparatus and, more particularly, to a display apparatus including a plurality of light emitting diode (LED) elements including a weak light-emitting area.

Background Art

Display apparatuses have been developed to have high brightness, high efficiency, and low power with a large screen size and a high image resolution. An LED display is designed to replace a liquid crystal display (LCD), but there are problems, such as a high price and a large size in accordance with a yield rate of an LED display Recently, micro LEDs have attracted major attention to overcome the problems.

A micro LED is a subminiature inorganic light emitting material that emits light by itself without a color filter and a backlight. The micro LED may refer to a subminiature LED having a size of a micrometer (μm) unit smaller than a general LED chip.

Micro LEDs are fabricated by growing a plurality of micro LEDs in a chip form on a wafer (growth substrate) through an epitaxial process, or the like. The micro LEDs are transferred onto a target substrate to constitute a display module.

In the related art, when the micro LEDs are transferred to the target substrate, a side molding may be added to increase a contrast ratio, and as a result, brightness may be reduced at a specific angle, or white balance may not maintained. Thus, there has been a demand for a technology for reducing or removing the adverse effects of the side molding which may affect image quality of a display module.

DISCLOSURE

Technical Problem

It is an object of the disclosure to provide a display apparatus to prevent image quality degradation by improving brightness and white balance through change of arrangement of a weak light-emitting area and a structure of a crystal layer of an LED element.

Technical Solution

According to an aspect of the present disclosure, a display apparatus may include: a substrate; and a plurality of light emitting diode (LED) elements arranged on the substrate in a matrix, wherein the plurality of LED elements include: a first LED element including a first light emitting layer and configured to emit a first light of a first color through the first light emitting layer, a second LED element including a second light emitting layer and configured to emit a second light of a second color through the second light emitting layer, and a third LED element including a third light emitting layer and configured to emit a third light of a third color through the third light emitting layer, wherein the first LED element, the second LED element, and the third LED element are disposed in a column direction of the plurality of LED elements, and constitute one pixel together, wherein the first light emitting layer includes a first weak light-emitting area, the second light emitting layer includes a second weak light-emitting area, the third light emitting layer includes a third weak light-emitting area, and wherein the first weak light-emitting area, the second weak light-emitting area, and the third weak light-emitting area are aligned in a line in the column direction, and wherein the first weak light-emitting area, the second weak light-emitting area, and the third weak light-emitting area have a brightness that is lower than an average brightness of the first LED element, the second LED element, and the third LED element, respectively.

The first LED element may further include: a terminal layer disposed at a lower portion of the first light emitting layer and connected to the substrate; and a sapphire layer disposed on an upper portion of the first light emitting layer, wherein the sapphire layer may have two facing surfaces that extend from the first light emitting layer in a perpendicular direction, and two tilted surfaces that extend from the first light emitting layer in a tilted direction at a preset angle.

The two tilted surfaces may extend in a direction opposite to the direction in which the first weak light-emitting area is formed.

In the first LED element, distances from the first weak light-emitting area to two sides of the first LED element, which are parallel with a row direction of the first light emitting layer, are equal to each other, a first side surface of the sapphire layer that is parallel with the row direction, extends in the perpendicular direction, and a second side surface of the sapphire layer that is parallel with the column direction, extends in the tilted direction.

In the first LED element, distances from the first weak light-emitting area to two sides of the first LED element, which are parallel with a row direction of the first light emitting layer, may be different from each other. A first side surface of the sapphire layer, which is parallel with the column direction, may extend in the perpendicular direction, and a second side surface of the sapphire layer that is parallel with the row direction, may extend in the tilted direction.

The terminal layer may include an anode terminal and a cathode terminal. The substrate may include an anode terminal coupling portion and a cathode terminal coupling portion. An arrangement of the anode terminal coupling portion and the cathode terminal coupling portion which are coupled with one or more LED elements among the plurality of LED elements may be opposite to an arrangement of the anode terminal coupling portion and the cathode terminal coupling portion which are coupled with another LED element among the plurality of LED elements.

The first LED element, the second LED element and the third LED element may be spaced apart from each other in a predetermined interval.

The display apparatus may further include: a side molding disposed at a gap among the plurality of LED elements on the substrate.

The side molding may include a light penetrating material through which light penetrates.

The display apparatus may further include: a bonding layer disposed on an upper portion of the substrate to bond the plurality of LED elements and the side molding to the substrate.

The bonding layer may include a light absorbing bonding material that absorbs the light that penetrates through the light penetrating material.

The display apparatus may include: a transparent molding layer disposed on the plurality of LED elements and an upper surface of the side molding.

The transparent molding layer comprises a light penetrating material through which light penetrates.

The display apparatus may further include: an optical film disposed on the transparent molding layer, wherein the optical film may be a neural density (ND) film with a neural feature with respect to a color.

The second LED element may be a green LED element, the first LED element may be any one of a red LED element or a blue LED element, and the third LED element may be different from the first LED element.

Effect of Invention

According to various embodiments, a display apparatus may prevent image quality degradation by improving brightness and white balance through change of arrangement of a weak light-emitting area and a structure of a crystal layer of an LED element.

DESCRIPTION OF DRAWINGS

The above and other aspects, features, and advantages of certain embodiments of the present disclosure will be more apparent from the following description taken in conjunction with the accompanying drawings, in which:

FIG. 2 is a diagram illustrating display modules included in the display apparatus according to an embodiment;

BEST MODE FOR CARRYING OUT THE INVENTION

Figure 1:
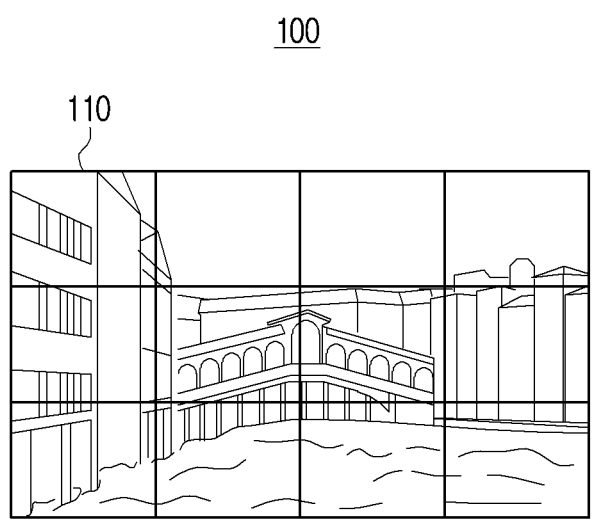
FIG. 1 is a diagram illustrating a display apparatus according to an embodiment.

Embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

The terms used in the disclosure and the claims are general terms identified in consideration of the functions of embodiments of the disclosure. However, these terms may vary depending on intention, legal or technical interpretation, emergence of new technologies, and the like of those skilled in the related art. In addition, in some cases, a term may be selected by the applicant, in which case the term will be described in detail in the description of the corresponding disclosure. Thus, the term used in this disclosure should be defined based on the meaning of term, not a simple name of the term, and the contents throughout this disclosure.

One or more specific embodiments of the disclosure are illustrated in the drawings and are described in detail in the detailed description. However, it is to be understood that the disclosure is not limited to the one or more specific embodiments, but includes all modifications, equivalents, and substitutions without departing from the scope and spirit of the disclosure. Also, well-known functions or constructions are not described in detail because they would obscure the disclosure with unnecessary detail.

Terms such as "first" and "second" used in various example embodiments may modify various elements, and does not limit the corresponding elements. These terms may be used to distinguish one element from another.

A singular expression includes a plural expression, unless otherwise specified. It is to be understood that the terms such as "comprise" may, for example, be used to designate a presence of a characteristic, number, step, operation, element, component, or a combination thereof, and not to preclude a presence or a possibility of adding one or more of other characteristics, numbers, steps, operations, elements, components or a combination thereof.

Terms such as "module," "unit," "part," and so on are used to refer to an element that performs at least one function or operation, and such element may be implemented as hardware or software, or a combination of hardware and software. Further, except for when each of a plurality of "modules," "units," "parts," and the like needs to be realized in an individual hardware, the components may be integrated in at least one module or chip and be realized in at least one processor.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

FIG. 1 is a diagram illustrating a display apparatus 100 according to an embodiment.

According to an embodiment, the display apparatus 100 may include one display module or a plurality of display modules 110.

For example, referring to FIG. 1, the display apparatus 100 according to an embodiment may include the plurality of display modules 110. The plurality of display modules 110 may be physically connected to each other to form a single display.

FIG. 2 is a diagram illustrating display modules according to an embodiment.

Referring to FIG. 2, each of a plurality of display modules 110-1 to 110-12 may be implemented as an LED display module including an inorganic LED.

Each LED display module may include a plurality of pixels including a red (R) LED element, a green (G) LED element, and a blue (B) LED element.

Referring to FIG. 2, the plurality of display modules 110-1 to 110-12 are coupled in an array of 4×3. The LED display modules arranged in a 4×3 array is merely an example and the number and the type of arrangement of LED display modules may be variously changed. For example, the number of pixels included in the display module 110 may be variously changed according to the purpose of a manufacturer, a manufacturing process, etc., and the arrangement and number of the display modules 110 constituting the display apparatus 100 may be variously changed according to the purpose of the manufacturer, the manufacturing process, or the like.

For example, the display apparatus 100 may be implemented as a large scale display device coupled with a plurality of display modules 110, for example, a digital signage, a wall display, or a video wall installed in a public place or a commercial place.

The display apparatus 100 including the plurality of display modules 110-1 to 110-12 may be collectively referred to as a cabinet and a sub-screen. The number of the display modules 110 constituting the cabinet or the sub-screen may not be fixed, and may vary widely.

Figure 3:
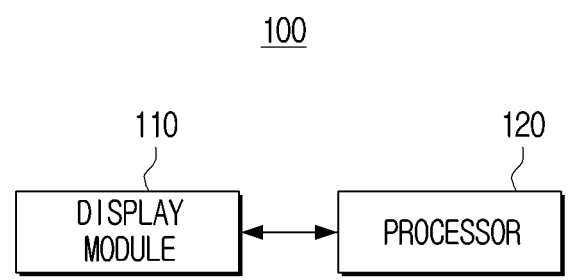
FIG. 3 is a block diagram illustrating a display apparatus according to an embodiment.

FIG. 3 is a block diagram illustrating the display apparatus 100 according to an embodiment.

Referring to FIG. 3, the display apparatus 100 according to an embodiment may include the display module 110 and a processor 120.

The display apparatus 100 may be implemented as a television (TV), but is not limited thereto, and may be applicable to any device including a display function such as a video wall, a large format display (LFD), a digital signage, and a digital information display (DID), a projector display, or the like. In addition, the display apparatus 100 may be implemented as various types displays, such as a liquid crystal display (LCD), an organic light-emitting diode (OLED), a liquid crystal on silicon (LCoS), a digital light processing (DLP), a quantum dot (QD) display panel, a quantum dot light-emitting diodes (QLED), Micro light-emitting diodes (pLEDs), or Mini LED. The display apparatus 100 may be implemented as a touch screen coupled with a touch sensor, a flexible display, a rollable display, a three-dimensional (3D) display, or a display in which a plurality of display modules are physically connected, or the like.

The display apparatus 100 according to an embodiment may be one of a plurality of display devices constituting the modular display device, and may include the plurality of display modules 110.

The display module 110 may display various images. The image may include a still image and a moving image, and the display module 110 may display various images such as a broadcast content, a multimedia content, or the like. The display module 110 may display a user interface (UI) and an icon.

The display module 110 may include an integrated circuit (IC) chip, and the IC chip may display an image based on an image signal received from the processor 120. For example, the IC chip may generate an LED driving signal based on an image signal received from the processor 120, and display an image by controlling light emission of a plurality of pixels included in the display module 110 based on the LED driving signal. According to an embodiment, the IC chip may be an LED driver IC chip.

The display module 110 according to an embodiment may be implemented as a display including a self-emitting element. For example, the display module 110 may be implemented as a display of various types such as, for example, and without limitation, a liquid crystal display (LCD), organic light emitting diodes (OLED) display, light emitting diodes (LED), micro LED, mini LED, plasma display panel (PDP), quantum dot (QD) display, quantum dot light-emitting diodes (QLED), or the like. In the display module 110, a backlight unit, a driving circuit which may be implemented as an a-si TFT, low temperature poly silicon (LTPS) TFT, organic TFT (OTFT), or the like, may be included as well. The display module 110 may be implemented as a touch screen coupled to a touch sensor, a flexible display, a rollable display, a third-dimensional (3D) display, a display in which a plurality of display modules 110-1 to 110-12 are physically connected, or the like.

The processor 120 may control overall operations of the display apparatus 100. The processor 120 may be configured with one or a plurality of processors. For example, the processor 120 may perform the operation of the electronic apparatus 100 according to various embodiments of the disclosure by executing at least one instruction stored in the memory.

The processor 120 according to an embodiment may be implemented with, for example, and without limitation, a digital signal processor (DSP) for image-processing of a digital image signal, a microprocessor, a graphics processor (GPU), an artificial intelligence (AI) processor, a neural processor or a neural processing unit (NPU), a time controller (TCON), or the like, but the processor is not limited thereto. The processor 120 may include, for example, and without limitation, one or more among a central processor (CPU), a micro controller unit (MCU), a microprocessor (MPU), a controller, an application processor (AP), a communication processor (CP), an advanced reduced instruction set computing (RISC) machine (ARM) processor, or may be defined as a corresponding term. The processor 120 may be implemented in a system on chip (SoC) type or a large scale integration (LSI) type having a built-in processing algorithm, application specific integrated circuit (ASIC) type, or a field programmable gate array (FPGA) type.

The processor 120 may drive an operating system or an application program to control hardware or software components connected to the processor 120 and may perform various data processing and operations. The processor 120 may load and process a command or data received from at least one of other components to a volatile memory and may store various data in a non-volatile memory.

Figure 4:
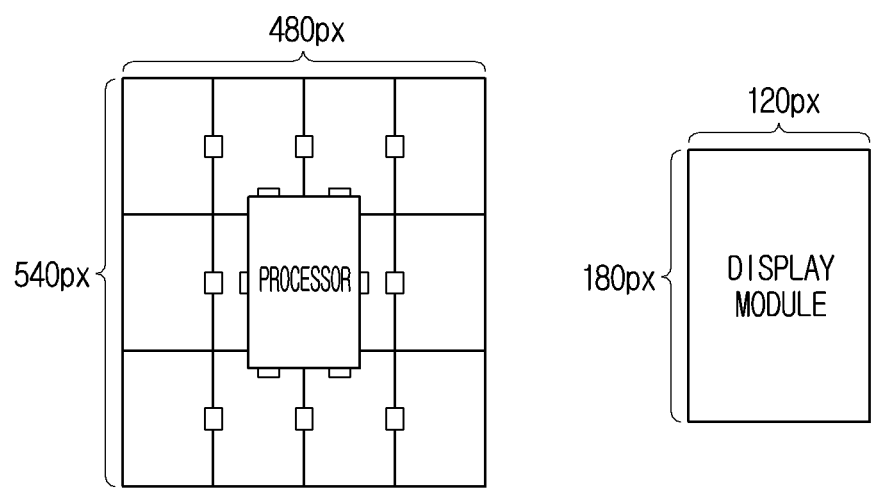
FIG. 4 is a diagram illustrating a display apparatus including a plurality of display modules in a 4×3 array according to an embodiment.
Figure 5:
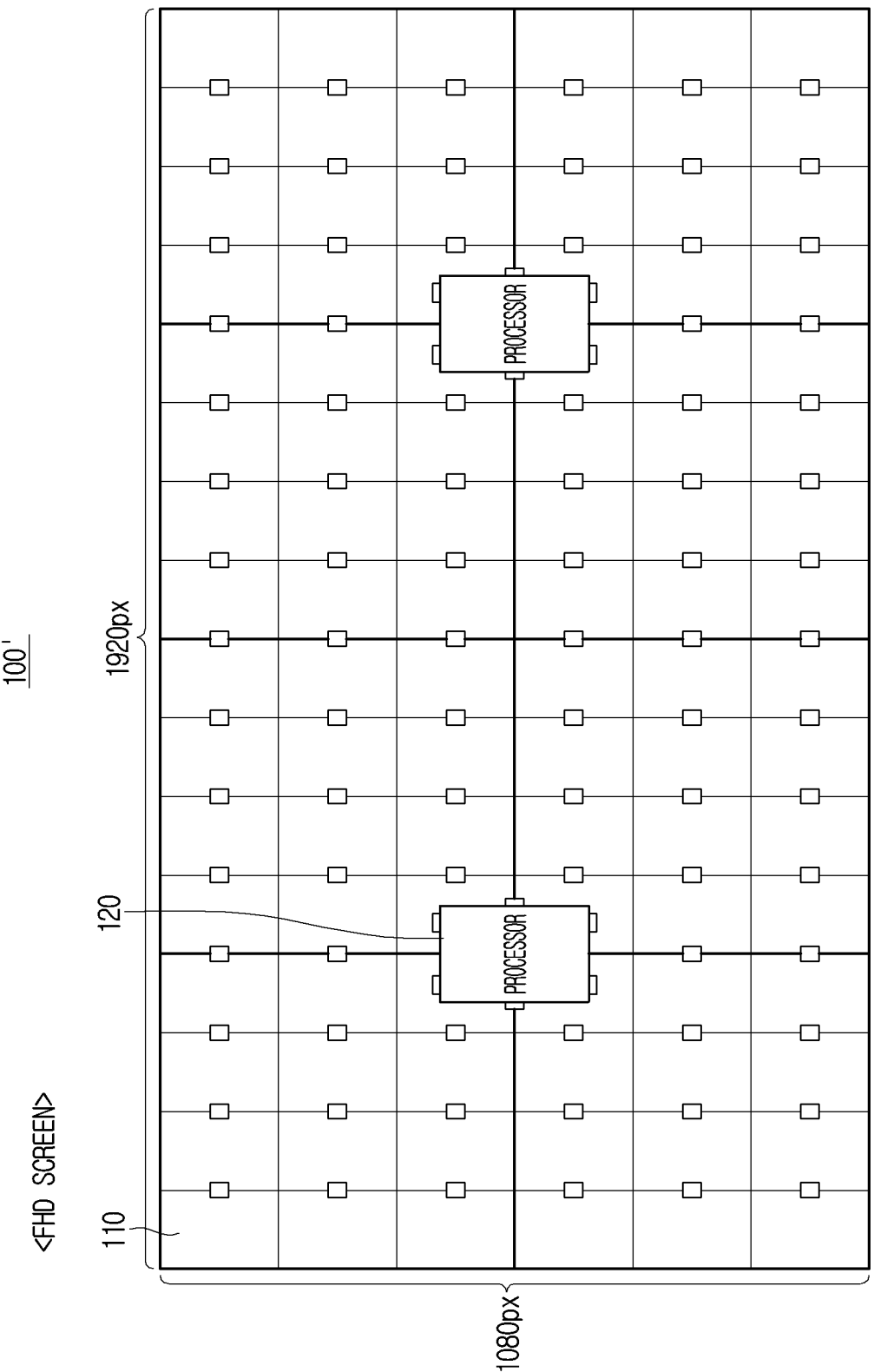
FIG. 5 is a diagram illustrating a display apparatus according to an embodiment.

With reference to FIGS. 4 and 5, the display apparatus 100 and the display module 110 according to an embodiment will be described.

FIG. 4 is a diagram illustrating a display apparatus including a plurality of display modules in a 4×3 array according to an embodiment.

The display apparatus 100 according to an embodiment may include a plurality of display modules 110-1 to 110-12. For example, the plurality of display modules 110-1 to 110-12 may be arranged in a matrix format (e.g., M×N, where M and N are natural numbers). The matrix may be in a square arrangement (e.g., M=N, here M and N are natural numbers, 16×16 array, 24×24 array, or the like), or may be in a different arrangement (e.g., M≠N, here M and N are natural numbers).

The LED of the LED display module according to an embodiment may be implemented with a micro LED. The micro LED may be an LED in a size of 5 to 100 micrometers and may refer to a subminiature self-emissive light emitting element without a color filter.

However, the LED display module is merely an example, and the display module may be implemented as a liquid crystal display (LCD) panel that is a planer display panel, an organic LED (OLED) panel, an active matrix OLED (AMO-LED) panel, a plasma display panel (PDP), or the like. Hereinafter, for convenience of description, the display module according to an embodiment is exemplified as the LED display module.

Referring to FIG. 4, the display apparatus 100 according to an embodiment may include a plurality of display modules 110-1 to 110-12 arranged in a 4×3 array. This is merely an example and embodiments are not limited thereto.

The display module 110 according to an embodiment may include a plurality of pixels arranged in a matrix form. Referring to FIG. 4, the display module 110 may include 21,600 pixels arranged in a 120×180 array for convenience of description, but this is merely an example and embodiments are not limited thereto.

For example, the display module 110 may include 43,200 pixels arranged in a 240×180 array. The size and ratio of the display module 110 may vary depending on the number of pixels included in the display module 110 and the distance between adjacent pixels (e.g., pixel pitch).

FIG. 5 is a diagram illustrating the display apparatus 100 according to an embodiment.

Referring to FIG. 5, a display apparatus 100' according to an embodiment may be implemented with a modular display apparatus 100' in which the plurality of display modules 110 or a plurality of cabinets are coupled.

Referring to FIG. 5, twelve (12) display modules 110 are named a sub-cabinet for convenience of description, and the modular display apparatus 100' including a full high definition (FHD) screen implemented with four sub-cabinets is illustrated, but it is not limited thereto. For example, the display apparatus 100 may be implemented as a modular display apparatus 100' including a plurality of display modules 110, cabinet, or sub-screen, thereby including various resolutions such as 4K (for example, 3840×2160) and 8K, or the like.

With reference to FIGS. 6 to 11, an array of a plurality of LED elements and a structure of the LED elements included in the display module 110 will be described.

Figure 6:
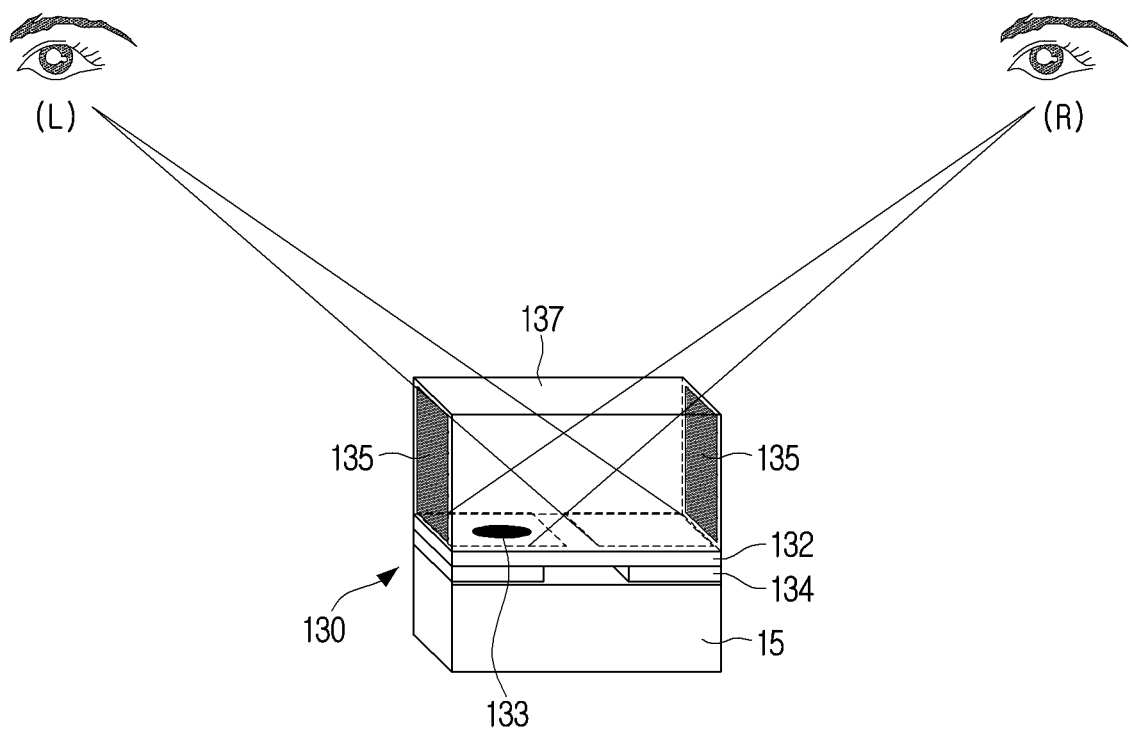
FIG. 6 is a perspective view of an LED element according to an embodiment.

FIG. 6 is a perspective view of the LED element 130 according to an embodiment.

Referring to FIG. 6, the display apparatus 100 according to an embodiment may include a substrate 15 and an LED element 130.

The substrate 15 may be a printed circuit board, and may supply power to a plurality of LED elements 130 that are mounted on a surface of the substrate 15

The LED light emitting device 130 may emit light by itself. In one embodiment, the micro LED element 130 may be a semiconductor chip having a width, a length, and a height of less than or equal to 10 μm to 100 μm, respectively, made of an inorganic light-emitting material, and may emit light by itself when power is supplied. However, the size and the structure of the LED light emitting device 130 are not limited to a certain size or a certain structure.

Each of the plurality of LED elements 130 may include a light emitting layer 132, a terminal layer 134, and a sapphire layer 137.

The plurality of LED elements 130 may include a first LED light emitting element 130-1 emitting a light of a first color, a second LED light emitting element 130-2 emitting a light of a second color, and a third LED light emitting element 130-3 emitting a light of a third color. The first LED light emitting element 130-1, the second LED light emitting element 130-2, and the third LED light emitting element 130-3 may be spaced apart from each other at predetermined intervals and may constitute one pixel 10-1.

The light emitting layer 132 may emit light in a direction of a light-emitting surface which is an upper surface and may be formed with a weak light-emitting area 133. The weak light-emitting area 133 may refer to an area that has a brightness lower than an average brightness of the light emitting layer 132 by a preset value. The weak light-emitting area 133 may be also referred to as a low brightness area.

The light emitting layer 132 without the weak light-emitting area 133 may be ideal, but in accordance with a feature of the LED element 130 which emits light by current flow generated by a cathode terminal 134-2 and an anode terminal 134-1, some areas of the light emitting layer 132 may not emit light or may emit weak light. The weak light-emitting area 133 may be formed because a terminal is connected to an upper side of the light emitting layer 132 in a manufacturing process of the micro LED element 130, a via hole passing through some areas of the light emitting layer 132. Current may be supplied up to an upper portion of the light emitting layer 132 through the via hole, but an area formed with the via hole may have degraded light emitting performance than other areas, and there may be a difficulty in completely removing the weak light-emitting area 133 in the subminiature micro LED element 130 and thus, the weak light-emitting area 133 may be formed.

The weak light-emitting area 133 may be formed in at least some areas of the light emitting layer 132, and at least a portion of the weak light-emitting area 133 may include a non-light-emitting area, and may be configured with only a non-light-emitting area. Although the weak light-emitting area 133 is shown as a black dot for convenience, a boundary of the weak light-emitting area 133 may be changed to be larger or smaller than the black dot. The weak light-emitting area 133 may be defined as an area having a relatively low brightness than other adjacent areas, or an area having a brightness that is lower than an average brightness of the light emitting layer 132 by a preset value.

A location where the weak light-emitting area 133 is formed may be diverse, and referring to FIG. 6, the weak light-emitting area 133 may be formed at a location adjacent to a left side (L) or a right side (R) from a central portion of the LED element 130.

The LED element 130 in which the weak light-emitting area 133 including a side molding 135 that blocks light transmission is formed may carry a brightness deviation in accordance with a field of view, and as a result, one pixel 10-1 may carry a degraded white balance according to the field of view.

Referring to FIG. 6, in an embodiment where the weak light-emitting area 133 is formed on an upper portion of the terminal layer 134 in the left (L) direction, the weak light-emitting area 133 may not be a problem for a viewer's gaze at the left side (L). However, in the gaze of the viewer at the right side (R), light transmission is blocked by the side molding 135, except for the weak light-emitting area 133, so that the light emitting layer 132 of the weak light-emitting area 133 may be mainly seen. Accordingly, the brightness of the LED element 130 may be reduced in the gaze of the viewer of the right side (R), and a brightness deviation may be generated while changing the field of view according to the position of the viewer.

In a structure where the first LED element 130-1 emitting the light of a first color, the second LED element 130-2 emitting the light of the second color and the third LED element 130-3 emitting the light of the third color constitute one pixel 10-1, one LED element 130 may be formed on the left side of the weak light-emitting area 133. When the weak light-emitting area 133 is formed on the right side, a specific color may carry a lower brightness by the weak light-emitting area 133 in the gaze of the view of the left side or the right side. As the position of the weak light-emitting area 133 of each LED element 130 constituting one pixel 10-1 is different, white balance may be degraded when the field of view is changed.

The side molding 135 may be disposed at a gap among a plurality of LED elements 130 on the substrate 15, and may block light emitted from the LED element 130 from being transmitted.

The side molding 135 may improve coupling reliability in a process of coupling the plurality of LED elements 130 with the substrate 15, and may improve a contrast ratio by blocking light reflection, thereby improving image quality of the display apparatus 100, and may minimize deviation among the plurality of display modules 110.

Figure 7:
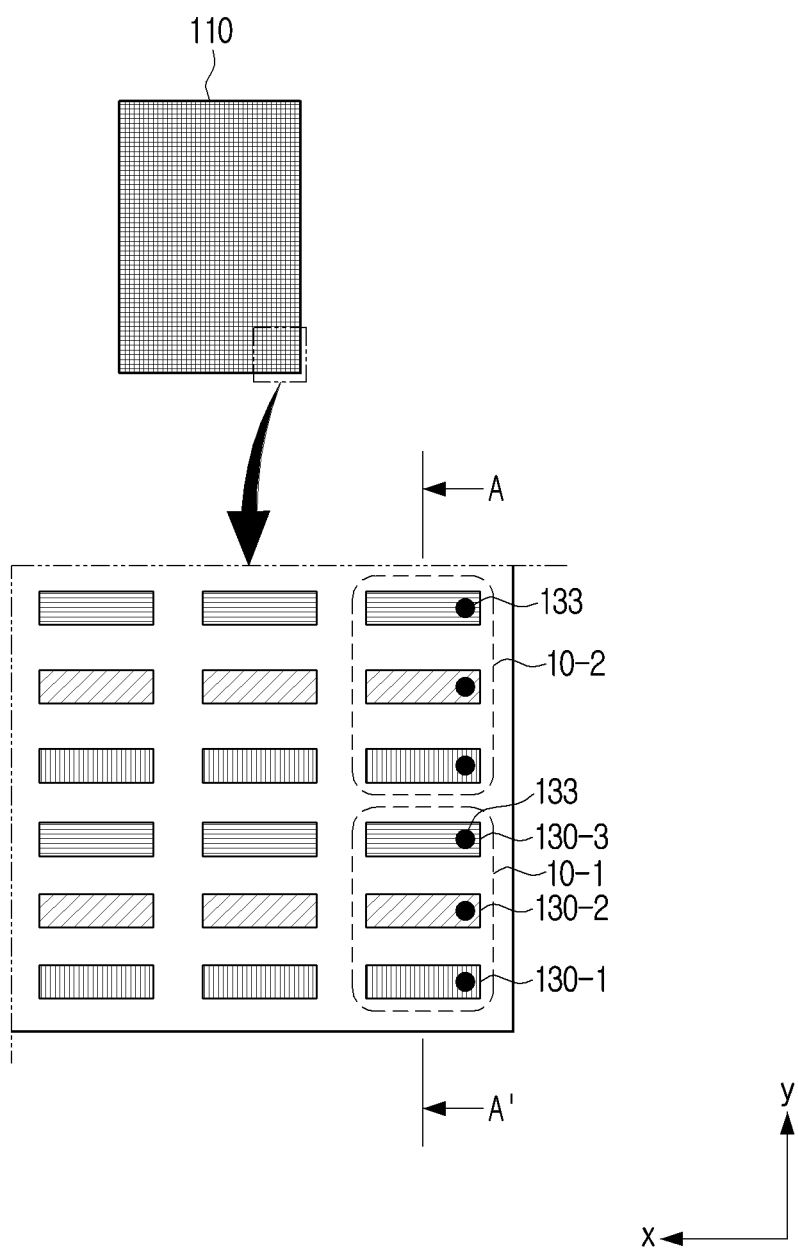
FIG. 7 is a diagram illustrating an arrangement of a plurality of LED elements according to an embodiment.

FIG. 7 is a diagram illustrating an arrangement of a plurality of LED elements 130 according to an embodiment.

Referring to FIG. 7, one pixel 10-1 of the display module 110 may include the first LED element 130-1, the second LED element 130-2, and the third LED element 130-3. For example, the second LED element 130-2 may be the G LED element 130, the first LED element 130-1 may be any one of the R LED element 130 or the B LED element 130, and the third LED element 130-3 may be implemented as one, which is different from the first LED element 130-1, between the R LED element 130 or the B LED element 130.

The plurality of LED elements 130 according to an embodiment may be arranged in a matrix form on the substrate 15, and the first to third LED elements 130-1, 130-2, and 130-3 constituting one pixel 10-1 may be arranged in a column direction, which is a x-axis direction as shown in FIG. 7. Hereinafter, for convenience of description, the y-axis direction as shown in FIG. 7 is referred to as a row direction and the x-axis direction is referred to as a column direction.

The first LED element 130-1, the second LED element 130-2, and the third LED light-emitting element 130-3 constituting one pixel 10-1 are may be aligned in a column direction and may be disposed on the substrate 15. The first LED element 130-1, the second LED element 130-2, and the third LED element 130-3 constituting another pixel 10-2 may be aligned in the same column direction as one pixel 10-1.

Figure 8A:
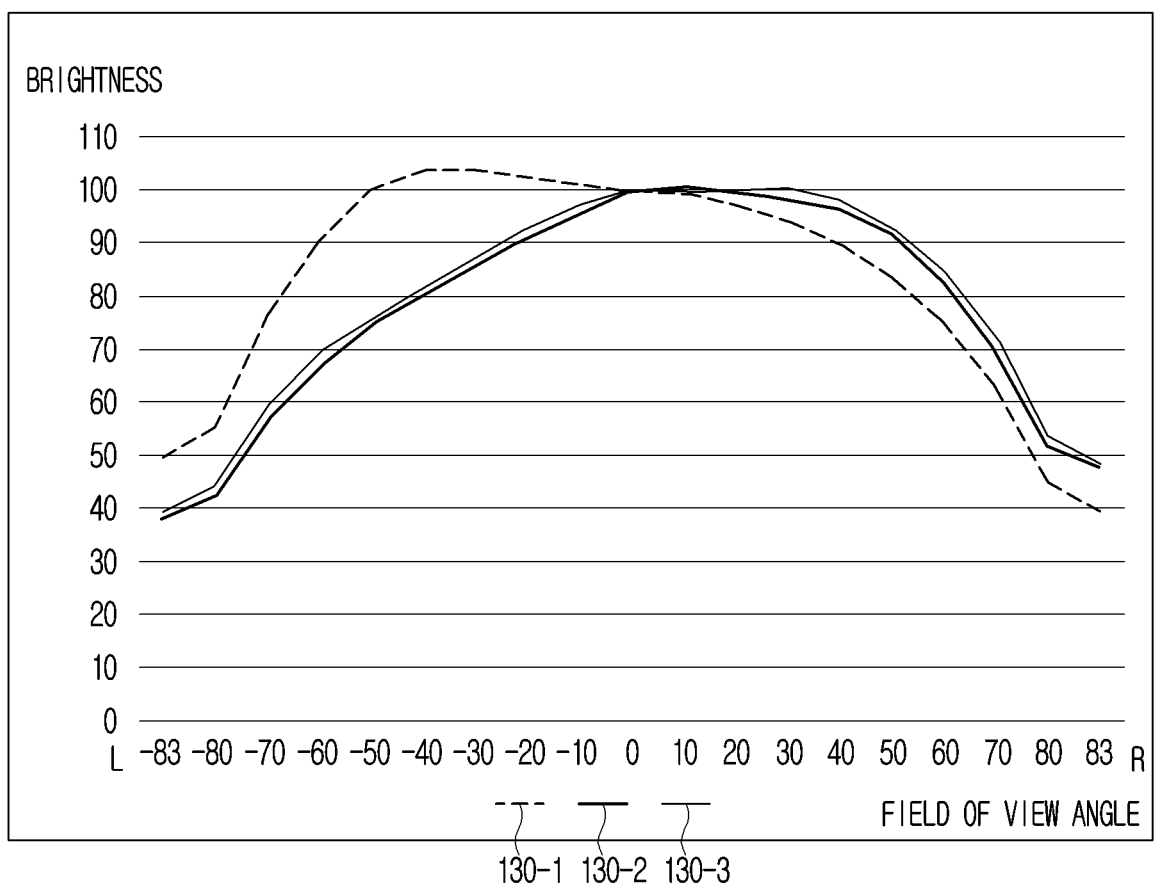
FIGS. 8A and 8B are diagrams illustrating brightness according to a field of view of each of a plurality of LED elements according to an embodiment.
Figure 8B:
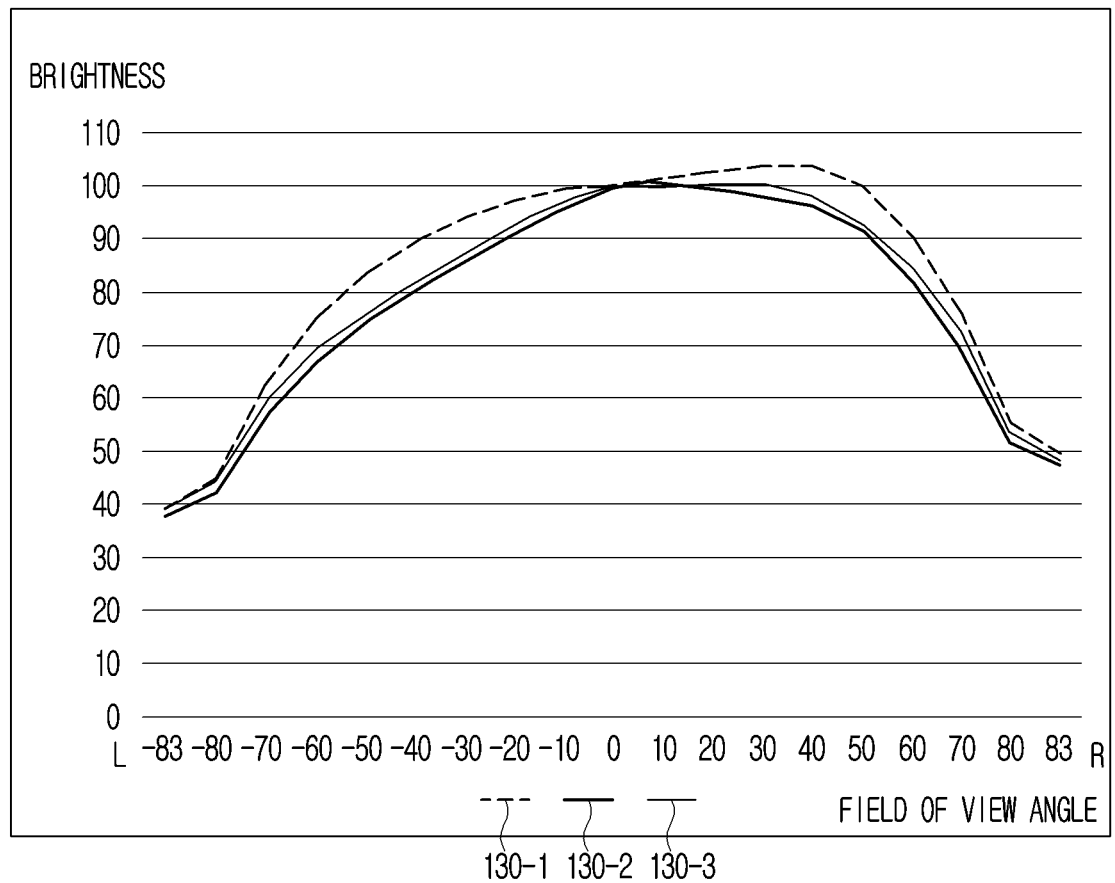

FIG. 8A is a graph showing brightness that changes according to a field of view of each of a plurality of LED elements in a comparative example. FIG. 8B is a graph showing brightness that changes according to a field of view of each of a plurality of LED elements 130 according to an embodiment.

FIG. 8A is a diagram illustrating brightness according to the field of view of the first to third LED elements 130-1, 130-2, and 130-3 in a comparative example in which the weak light-emitting area 133 is not aligned, and FIG. 8B is a diagram illustrating brightness according to the field of view of the first to third LED elements 130-1, 130-2, and 130-3 in an embodiment where the weak light-emitting area 133 is aligned in a line.

Referring to FIG. 8A, in the first LED element 130-1, the brightness in the left field of view at about 50 degrees may be maintained to be equal to or higher than the brightness in the central field of view at 0 degrees, but the brightness in the right field of view may gradually decrease as it moves away from the central portion.

In the second LED element 130-2 and the third LED element 130-3, the brightness in the right field of view at about 50 degrees may be maintained to be the same as or similar to the brightness in the central field of view at 0 degrees, but the brightness in the left field of view gradually decreases as it moves away from the central portion.

In one pixel 10-1 that has the brightness as shown in FIG. 8A, the first LED element 130-1 has a weak light-emitting area 133 formed on the left side thereof, and the weak light-emitting areas 133 of the second LED element 130-2 and the third LED element 130-3 may be formed on the right side thereof. According to the comparative example in which the weak light-emitting area 133 is not aligned in a line in the same direction, the brightness of the LED element that emits one of the R, G, and B colors may decrease as the field of view angle increases, thereby lowering white balance.

Referring to FIG. 8B, the brightness of the first LED element 130-1, the second LED element 130-2, and the third LED element 130-3 in the right field of view at about 50 degrees is maintained to be the same as or similar to the brightness in the central field of view, but the brightness of the left field of view may gradually decrease as it moves away from the central portion.

Even if brightness decreases in accordance with the field of view, the brightness of each of the first LED element 130-1, the second LED element 130-2, and the third LED element 130-3 is reduced by a similar degree, so the respective LED elements 130 may prevent that white balance is degraded according to the field of view.

The first LED element 130-1, the second LED element 130-2, and the third LED element 130-3 may prevent degradation of white balance according to the field of view, as respective weak light-emitting areas 133 are aligned in a column direction, and may improve image quality of the display apparatus 100.

Figure 9:
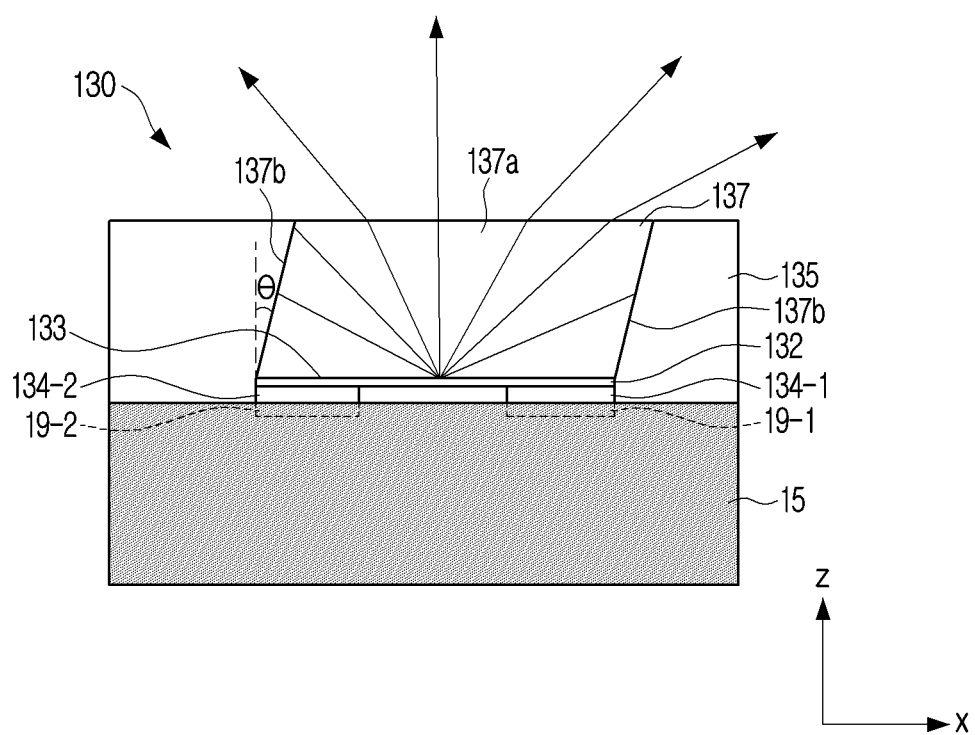
FIG. 9 is a cross-sectional view of an LED element according to an embodiment.

FIG. 9 is a cross-sectional view of the LED element 130 according to an embodiment.

Referring to FIG. 9, the LED element 130 according to an embodiment may include a sapphire layer 137.

The sapphire layer 137 may be disposed on an upper portion of the light emitting layer 132. In the cutting process of the manufacturing process, the sapphire layer 137 may include a shape tilted in the cutting direction. In the four side surfaces extending to the upper portion of the light emitting layer 132, two facing sides 137a may extend perpendicularly from the light emitting layer 132, that is, z-axis direction as shown in FIG. 9, and the other two sides (i.e., also referred to as "tilted sides") 137b may be tilted from the light emitting layer at a predetermined angle (θ) in the cutting direction. The two tilted sides 137b may be parallel with each other. An acute angle may be formed between one of the tilted sides 137b and the light emitting layer 132, and an obtuse angle may be formed between another one of the tilted sidle 137b and the light emitting layer 132.

As the two sides 137b are tilted, the light emitted from the light emitting layer 132 may be transmitted at a wider angle toward the tilted direction of the sapphire layer 137. Referring to FIG. 9, the sapphire layer 137 is tilted in the right direction (from the perpendicular direction of the light emitting layer 132), and the light is more widely spread in the right direction than the left direction.

In the sapphire layer 137, the two tilted sides 137b may extend in a direction opposite to where the weak light-emitting area 133 is formed. For example, the titled sides 137b are tilted to the right (from the perpendicular direction) when the weak light-emitting area 133 is formed on the left side of the light emitting layer 132. On the other hand, the titled sides 137*b* are tilted to the left (from the perpendicular direction) when the weak light-emitting area 133 is formed on the right side of the light emitting layer 132. The result of the embodiment will be described with reference to FIG. 10.

The terminal layer 134 may be disposed under the light emitting layer 132 and may connect the LED element 130 and the substrate 15. The terminal layer 134 may include an anode terminal 134-1 and a cathode terminal 134-2, and the substrate 15 may include an anode terminal coupling portion 19-1 and a cathode terminal coupling portion 19-2. The anode terminal coupling portion 19-1 may be connected to the anode terminal 134-1 of the terminal layer 134, and the cathode terminal coupling portion 19-2 may be connected to the cathode terminal 134-2 of the terminal layer 134, so that the substrate 15 may supply power to the LED element 130.

The weak light-emitting area 133 of one of the first LED element 130-1, the second LED element 130-2, and the third LED element 130-3 may be formed adjacent to the cathode terminal 134-2, and the weak light-emitting area 133 of another one of the first LED element 130-1, the second LED element 130-2, and the third LED element 130-3 may be formed adjacent to the side of the anode terminal 134-1. In a comparative example, when the anode terminal coupling portion 19-1 and the cathode terminal coupling portion 19-2 of the substrate 15 include the same arrangement, there may be a difficulty in aligning the weak light-emitting area 133 in a line.

According to one embodiment, the arrangement of the anode terminal coupling portion 19-1 and the cathode terminal coupling portion 19-2 coupled to a first type LED (e.g., a Red LED) of the plurality of LED elements 130 may be in the opposite direction to the arrangement of the anode terminal coupling portion 19-1 and the cathode terminal coupling portion 19-2 coupled to a second type LED (e.g., a green LED) of the plurality of LED elements 130, and thus, the direction in which the weak light-emitting area 133 of the LED light-emitting element 130 is disposed in the process of disposing the LED element 130 on the substrate 15 may be set.

For example, in the substrate 15 according to an embodiment, the arrangement direction of the anode terminal coupling portion 19-1 and the cathode terminal coupling portion 19-2 for mounting the plurality of LED elements 130 on the substrate 15 may have a unified direction.

The position where the weak light-emitting area 133 is formed on the LED element 130 may be adjacent to the anode terminal 134-1 or adjacent to the cathode terminal 134-2, and the first LED light-emitting element 130-1 may be formed with the weak light-emitting area 133 in the direction of the anode terminal 134-1, and the other LED light-emitting elements 130-2 and 130-3 may be formed with a weak light-emitting area in the direction of the cathode terminal 134-2.

The first LED element 130-1, the second LED element 130-2, and the third LED element 130-3 may align the respective weak light-emitting areas 133 in a column direction, as the arrangement of the anode terminal coupling portion 19-1 and the cathode terminal coupling portion 19-2 coupled to the first LED element 130-1 may have the opposite direction to the arrangement of the anode terminal coupling portion 19-1 and the cathode terminal coupling portion 19-2 coupled to the other LED elements 130-2 and 130-3.

On the substrate 15 according to an embodiment, the anode terminal coupling portion 19-1 and the cathode terminal coupling portion 19-2 of at least one of the plurality of LED elements 130 are arranged in a direction opposite to the arrangement direction of the anode terminal coupling portion 19-1 and the cathode terminal coupling portion 19-2 of at least another one of the plurality of LED elements 130, so that the weak light-emitting area 133 of the plurality of LED elements 130 may be arranged in line without being restricted to the position of forming the weak light-emitting area 133 of the plurality of LED elements 130.

Figure 10:
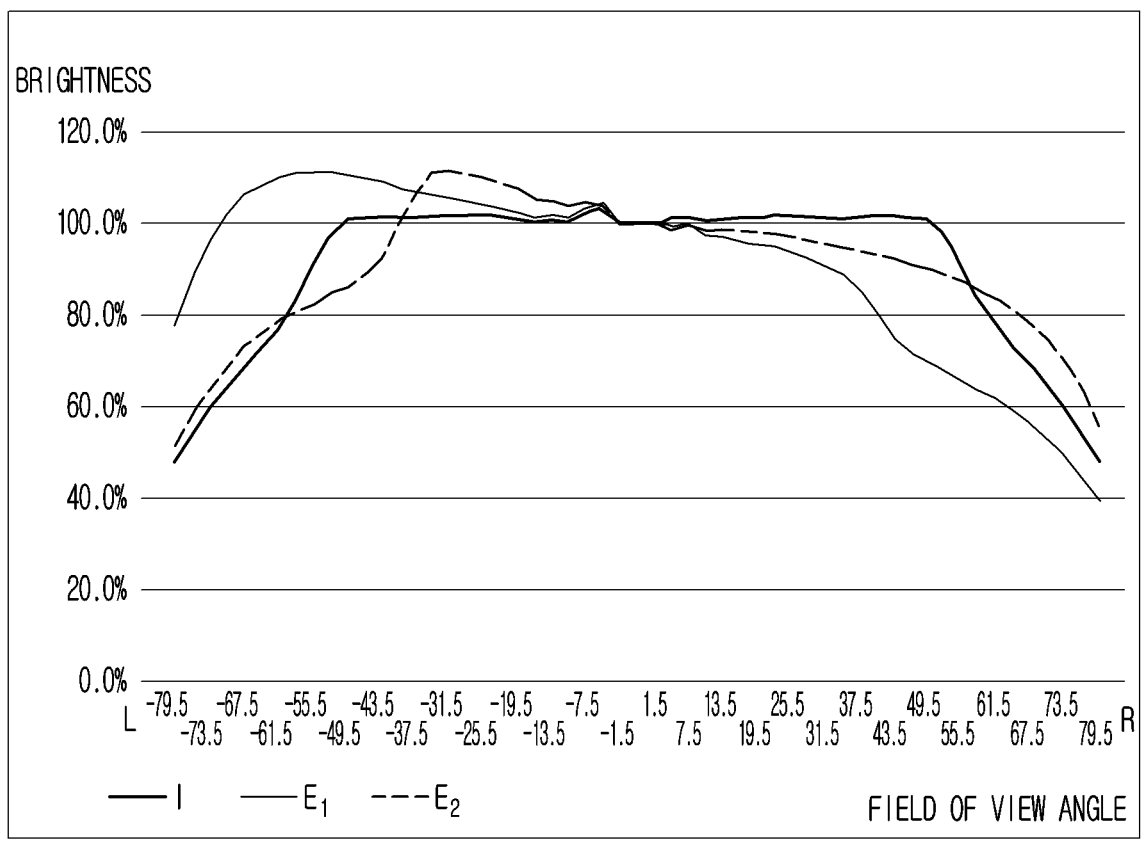
FIG. 10 is a diagram illustrating brightness in accordance with a field of view of a plurality of LED elements according to an embodiment.

FIG. 10 is a diagram illustrating brightness in accordance with a field of view of a plurality of LED elements 130 according to an embodiment.

Referring to FIG. 10, line I represents the brightness according to the ideal field of view of a plurality of LED elements 130, line E1 represents brightness according to the field of view of a plurality of LED elements 130 having weak light-emitting areas 133, in which the cutting direction of the sapphire layer 137 is not tilted, and line E2 represents brightness according to the field of view of a plurality of LED elements 130 having weak light-emitting areas 133, in which the cutting direction of the sapphire layer 137 is tilted.

Line I represents brightness according to the ideal field of view of the plurality of LED elements 130, and more particularly, represents the brightness value according to the field of view of the plurality of LED elements 130 including the light emitting layer 132 in which the weak light-emitting area 133 is not formed. Referring to Line I, it is possible to provide a stable brightness at a field of view within 50 degrees, and a brightness value decreases by the side molding 135 at a field of view of 50 degrees or more.

Line E1 represents the brightness according to the field of view in the embodiment in which the cutting direction of the sapphire layer 137 is not adjusted (e.g., not tilted) in the plurality of LED elements 130 including the light emitting layer 132 formed with the weak light-emitting area 133. The brightness is gradually reduced as the field of view is widened in the right direction, and the brightness of about 70% or less in the right 50 degree position may be confirmed. However, as the field of view is widened in the left direction, the brightness is gradually increased, and the brightness of about 110% in the left 50-degree position may be confirmed.

In the embodiment of the line E1, there is a large difference in brightness values according to the field of view in the left and right directions, so that the display may be seen dark for some viewers according to the viewer's location and the display may appear bright for some viewers.

In a plurality of LED elements 130 including a light emitting layer 132 on which a weak light-emitting area 133 is formed, line E2 represents the brightness according to the field of view of the embodiment in which the tilt direction of two sides of the sapphire layer 137 is opposite to the direction in which the weak light-emitting area 133 is formed, and a brightness of about 90% is identified at a right 50 degree position in the right direction, and a brightness of about 90% at a left 50 degree position.

In the embodiment of line E2, there is a change in brightness as the field of view widens in left or right directions, but when compared with line E1, bright distribution close to line I, which is more ideal than line E1, may be provided.

In the display apparatus 100 according to an embodiment, the tilt direction of the two sides along the half direction of the sapphire layer 137 is opposite to the direction in which the weak light-emitting area 133 is formed and a stable brightness may be provided even when the field of view is widened.

In an embodiment, the weak light-emitting area 133 is formed at the center position in the vertical direction of the light emitting layer 132, but in other embodiments, the light emitting layer 132 may have different distances from the weak light-emitting area 133 to the upper side or the lower side.

Therefore, in the LED light element 130 having the same distance from the weak light-emitting area 133 to two sides parallel to the row direction of the light emitting layer 132 among the plurality of LED elements 130 (e.g., when the light-emitting area 133 is located at the center position of the light emitting layer 132), the sapphire layer 137 may include a side surface parallel with the row direction to be extended in a perpendicular direction (e.g., a normal direction of the light emitting layer 132), and the side surface parallel with the column direction may be extended in a tilted direction.

In the LED light element 130 having different distances from the weak light-emitting area 133 to two sides parallel to the row direction of the light emitting layer 132 among the plurality of LED elements 130 (e.g., when the light-emitting area 133 is not located at the center position of the light emitting layer 132), the sapphire layer 137 may include the side surface parallel with the column direction extended in the perpendicular direction, and the side surface parallel to the row direction may be extended in a tilted manner. A side surface parallel to the row direction of the sapphire layer 137 may include a tilt in a direction opposite to the direction in which the weak light-emitting area 133 is formed, thereby including the effect of minimizing a change in brightness according to the gaze height of the viewer.

Figure 11:
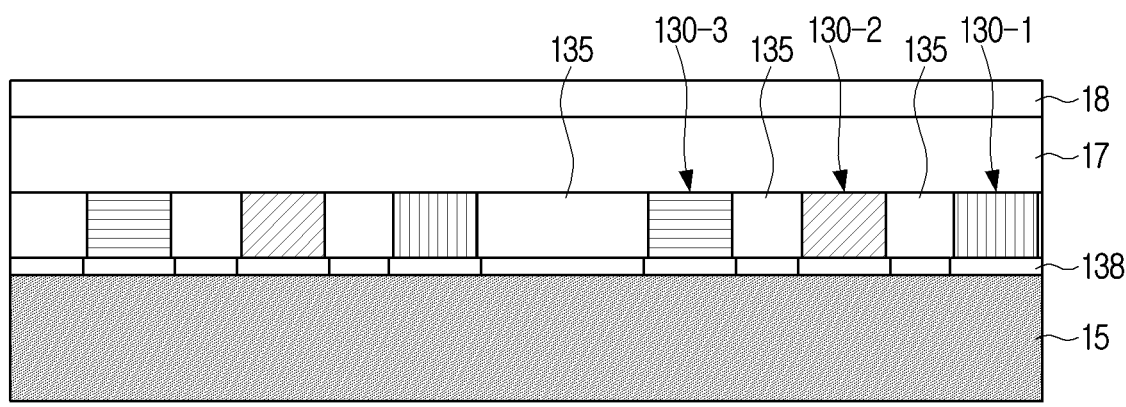
FIG. 11 is a cross-sectional view in A-A' direction of the display apparatus of FIG. 7.

FIG. 11 is a cross-sectional view in A-A' direction of the display apparatus 100 of FIG. 7.

Referring to FIG. 11, the display apparatus 100 according to an embodiment may further include a bonding layer 138, a clear molding layer 17, and an optical film 18.

The bonding layer 138 may be disposed on an upper portion of the substrate 15 to bond the plurality of LED elements 130 and the side molding 135 to the substrate 15, and may be formed of an anisotropic conductive film, or may be the bonding layer 138 formed through a soldering process.

The clear molding layer 17 may be disposed on the upper surface of the plurality of LED elements 130 and the side molding 135, to transmit light. The clear molding layer 17 may include a transparent material such as epoxy, silicon, and UV, or the like, and may be also referred to as a transparent molding layer. The optical film 18 may be disposed on the upper surface of the clear molding layer 17 and may be a neutral density (ND) film with a neutral feature with respect to the color.

In the above-described embodiment, the side molding 135 disposed in a gap spaced apart from the plurality of LED elements 130 has an effect of increasing a contrast ratio by blocking light emitted from the LED light-emitting element 130, but may limit the field of view of the LED element 130.

In a still another embodiment, the side molding 135 may transmit light. The bonding layer 138 may include the light-absorbing bonding material to absorb light that penetrates the side molding 135.

The side molding 135 may pass 10% to 100% of incident light, and may not entirely block light emitted from the side LED element 130, thereby effectively improving the field of view.

Because the bonding layer 138 is made of a light absorbing material, the bonding layer 138 disposed under the side molding 135 may absorb light without reflecting light, and as a result, the side molding 135 may have an effect of increasing the contrast ratio as in the embodiment in which the side molding 135 blocks light. In this example, when the bonding layer 138 covers the entire surface of the substrate 15 and completely blocks light, an error may occur in a process of arranging the electrodes on the substrate 15, and the bonding layer 138 may be made of a bonding material including a predetermined level of light absorption.

The bonding layer 138 may maintain the contrast ratio by absorbing the emitted light, and the side molding 135 may reduce brightness deviation according to the field of view by passing through light, thereby improving white balance.

While example embodiments of the disclosure have been illustrated and described, the disclosure is not limited to the specific embodiments described above. It will be understood by those skilled in the art that various changes in form and details may be made therein without departing from the true spirit and full scope of the disclosure, including the appended claims and their equivalents.

What is claimed is:

1. A display apparatus comprising:
   a substrate; and
   a plurality of light emitting diode (LED) elements arranged on the substrate in a matrix,
   wherein the plurality of LED elements comprise:
   a first LED element comprising a first light emitting layer and configured to emit a first light of a first color through the first light emitting layer,
   a second LED element comprising a second light emitting layer and configured to emit a second light of a second color through the second light emitting layer, and
   a third LED element comprising a third light emitting layer and configured to emit a third light of a third color through the third light emitting layer,
   wherein the first LED element, the second LED element, and the third LED element are disposed in a column direction of the plurality of LED elements, and constitute one pixel together,
   wherein the first light emitting layer comprises a first weak light-emitting area, the second light emitting layer comprises a second weak light-emitting area, the third light emitting layer comprises a third weak light-emitting area, and the first weak light-emitting area, the second weak light-emitting area, and the third weak light-emitting area appear due to current flow generated by an anode electrode and a cathode electrode provided respectively,
   wherein the first weak light-emitting area, the second weak light-emitting area, and the third weak light-emitting area are aligned in a line in the column direction, and
   wherein the first weak light-emitting area, the second weak light-emitting area, and the third weak light-emitting area have a brightness that is lower than an average brightness of the first LED element, the second LED element, and the third LED element, respectively.

2. The display apparatus of claim 1, wherein the first LED element further comprises:
   a terminal layer disposed at a lower portion of the first light emitting layer and connected to the substrate, wherein the current flows from the terminal layer to the first light emitting layer through a via hole; and
   a sapphire layer disposed on an upper portion of the first light emitting layer,
   wherein the sapphire layer has two facing surfaces that extend from the first light emitting layer in a perpendicular direction, and two tilted surfaces that extend from the first light emitting layer in a tilted direction at a preset angle.

3. The display apparatus of claim 2, wherein the two tilted surfaces extend in a direction opposite to the direction in which the first weak light-emitting area is formed.

4. The display apparatus of claim 3, wherein, in the first LED element, distances from the first weak light-emitting area to two sides of the first LED element, which are parallel with a row direction of the first light emitting layer, are equal to each other, a first side surface of the sapphire layer that is parallel with the row direction, extends in the perpendicular direction, and
 a second side surface of the sapphire layer that is parallel with the column direction, extends in the tilted direction.

5. The display apparatus of claim 3, wherein, in the first LED element, distances from the first weak light-emitting area to two sides of the first LED element, which are parallel with a row direction of the first light emitting layer, are different from each other,
 a first side surface of the sapphire layer, which is parallel with the column direction, extends in the perpendicular direction, and
 a second side surface of the sapphire layer that is parallel with the row direction, extends in the tilted direction.

6. The display apparatus of claim 3, wherein the terminal layer comprises an anode terminal and a cathode terminal,
 wherein the substrate comprises an anode terminal coupling portion and a cathode terminal coupling portion, and
 wherein an arrangement of the anode terminal coupling portion and the cathode terminal coupling portion which are coupled with one or more LED elements among the plurality of LED elements is opposite to an arrangement of the anode terminal coupling portion and the cathode terminal coupling portion which are coupled with another LED element among the plurality of LED elements.

7. The display apparatus of claim 1, wherein the first LED element, the second LED element and the third LED element are spaced apart from each other in a predetermined interval.

8. The display apparatus of claim 1, further comprising:
 a side molding disposed at a gap among the plurality of LED elements on the substrate.

9. The display apparatus of claim 8, wherein the side molding comprises a light penetrating material through which light penetrates.

10. The display apparatus of claim 9, further comprising:
 a bonding layer disposed on an upper portion of the substrate to bond the plurality of LED elements and the side molding to the substrate.

11. The display apparatus of claim 10, wherein the bonding layer comprises a light absorbing bonding material that absorbs the light that penetrates through the light penetrating material.

12. The display apparatus of claim 8, further comprising:
 a transparent molding layer disposed on the plurality of LED elements and an upper surface of the side molding.

13. The display apparatus of claim 12, wherein the transparent molding layer comprises a light penetrating material through which light penetrates.

14. The display apparatus of claim 12, further comprising:
 an optical film disposed on the transparent molding layer,
 wherein the optical film is a neural density (ND) film with a neural feature with respect to a color.

15. The display apparatus of claim 1, wherein the second LED element is a green LED element,
 wherein the first LED element is any one of a red LED element or a blue LED element, and
 wherein the third LED element is different from the first LED element.

16. The display apparatus of claim 1, wherein the first LED element further comprises a sapphire layer disposed on the first light emitting layer,
 wherein the sapphire layer has two facing surfaces that extend from the first light emitting layer in a perpendicular direction, and two tilted surfaces that extend from the first light emitting layer in a tilted direction at a preset angle, and
 wherein the tilted surfaces have a rightward tilt from the perpendicular direction when the first weak light-emitting area is formed on a left side of the first light emitting layer, and the tilted surfaces have a leftward tilt from the perpendicular direction when the first weak light-emitting area is formed on a right side of the first light emitting layer.

17. The display apparatus of claim 1, wherein the first weak light-emitting area, the second weak light-emitting area, and the third weak light-emitting area comprise a via hole through which current is supplied to the first light emitting layer, the second light emitting layer, and the third light emitting layer.

\* \* \* \* \*